(12) United States Patent
Sorg et al.

(10) Patent No.: US 11,749,959 B2
(45) Date of Patent: Sep. 5, 2023

(54) SEMICONDUCTOR LASER

(71) Applicant: OSRAM OLED GmbH, Regensburg (DE)

(72) Inventors: Jörg Erich Sorg, Regensburg (DE); Frank Singer, Regenstauf (DE); Christoph Koller, Hemau (DE)

(73) Assignee: OSRAM OLED GMBH, Regensburg (DE)

(*) Notice: Subject to any disclaimer, the term of this patent is extended or adjusted under 35 U.S.C. 154(b) by 418 days.

(21) Appl. No.: 17/261,300

(22) PCT Filed: Jul. 15, 2019

(86) PCT No.: PCT/EP2019/069027
§ 371 (c)(1),
(2) Date: Jan. 19, 2021

(87) PCT Pub. No.: WO2020/016185
PCT Pub. Date: Jan. 23, 2020

(65) Prior Publication Data
US 2021/0281041 A1   Sep. 9, 2021

(30) Foreign Application Priority Data
Jul. 19, 2018  (DE) .................. 102018117518.3

(51) Int. Cl.
*H01S 5/02255* (2021.01)
*H01S 5/00* (2006.01)
(Continued)

(52) U.S. Cl.
CPC ........ *H01S 5/02255* (2021.01); *H01S 5/0087* (2021.01); *H01S 5/028* (2013.01);
(Continued)

(58) Field of Classification Search
CPC .................................................. H01S 5/02326
See application file for complete search history.

(56) References Cited

U.S. PATENT DOCUMENTS

| 2003/0007257 A1* | 1/2003 | Bell, Jr. ............. | H01S 5/0267 359/618 |
| 2005/0062056 A1* | 3/2005 | Baugh ................ | G02B 6/4292 257/98 |

(Continued)

FOREIGN PATENT DOCUMENTS

| DE | 69218431 T2 | 9/1997 |
| DE | 29624438 U * | 10/2003 |

(Continued)

OTHER PUBLICATIONS

Asami, Kazuki, Notice of Reasons for Rejection in corresponding Japanese Application No. 2021-500223 dated Mar. 8, 2022, 13 pages.

(Continued)

*Primary Examiner* — Tuan N Nguyen
(74) *Attorney, Agent, or Firm* — MH2 TECHNOLOGY LAW GROUP LLP

(57) ABSTRACT

The invention relates to a semiconductor laser including a carrier, an edge-emitting laser diode which is arranged on the carrier and which has an active zone for generating laser radiation and a facet with a radiation exit area, an optical element which covers the facet, a connecting material which is arranged between the optical element and the facet, a molded body which covers the laser diode and the optical element at least in places, wherein the optical element is at least partially transparent to the laser radiation emitted by the laser diode during operation, and the optical element is designed to change the main propagation direction of the laser radiation entering the optical element during operation.

13 Claims, 4 Drawing Sheets

(51) Int. Cl.
*H01S 5/02234* (2021.01)
*H01S 5/028* (2006.01)
*H01S 5/40* (2006.01)
*H01S 5/02216* (2021.01)
*H01S 5/185* (2021.01)

(52) U.S. Cl.
CPC ...... *H01S 5/02216* (2013.01); *H01S 5/02234* (2021.01); *H01S 5/185* (2021.01); *H01S 5/4012* (2013.01); *H01S 5/4031* (2013.01); *H01S 5/4075* (2013.01)

(56) References Cited

U.S. PATENT DOCUMENTS

| | | | |
|---|---|---|---|
| 2015/0131692 A1* | 5/2015 | Hayamizu | G02B 6/4214 372/107 |
| 2017/0051883 A1 | 2/2017 | Raring et al. | |
| 2017/0146793 A1 | 5/2017 | Gudeman et al. | |
| 2018/0166850 A1 | 6/2018 | Gudeman | |
| 2019/0115718 A1 | 4/2019 | Itoh | |

FOREIGN PATENT DOCUMENTS

| | | |
|---|---|---|
| DE | 29624438 U1 | 10/2003 |
| DE | 102013204502 A1 | 9/2013 |
| JP | H04014888 | 1/1992 |
| JP | H04320386 | 11/1992 |
| JP | H05175360 | 7/1993 |
| JP | 2003101118 A | 4/2003 |
| JP | 2006145781 A | 6/2006 |
| JP | 2006276736 A | 10/2006 |
| JP | 2009025458 A | 2/2009 |
| JP | 2012109201 A | 6/2012 |
| JP | 2016218327 A | 12/2016 |
| JP | 2018037440 A | 3/2018 |
| WO | 2016180851 A1 | 11/2016 |
| WO | 2017169773 A1 | 10/2017 |
| WO | 2019072759 A1 | 4/2019 |

OTHER PUBLICATIONS

Asami, Kazuki, Notice of Reasons for Rejection (with English Translation) in Japanese Application No. 2021-500223 dated Sep. 27, 2022, 9 pages.

* cited by examiner

SEMICONDUCTOR LASER

CROSS-REFERENCE TO RELATED APPLICATIONS

This patent application is a national stage entry from International Application No. PCT/EP2019/069027, filed on Jul. 15, 2018, published as International Publication No. WO 2020/016185 A1 on Jan. 23, 2020, and claims priority under 35 U.S.C. § 119 from German patent application 10 2018 117 518.3, filed Jul. 19, 2018, the entire contents of all of which are incorporated by reference herein.

A semiconductor laser is specified.

It is an object of the present disclosure to specify a semiconductor laser that can be operated efficiently.

According to at least one embodiment of the semiconductor laser, the semiconductor laser comprises a carrier. The carrier can be a so-called submount. The carrier can be a three-dimensional body and for example have the shape of a cylinder, a disk or a cuboid. The carrier can have a main plane of extension. For example, the main extension plane of the carrier is parallel to a surface, such as a top surface, of the carrier. The carrier can comprise a semiconductor material.

It is possible that the carrier includes a driver by which the semiconductor laser can be controlled. Alternatively, it is possible that the carrier represents an electronically passive component and serves only as a mounting level.

According to at least one embodiment of the semiconductor laser, the semiconductor laser comprises an edge-emitting laser diode which is arranged on the carrier and which has an active zone for generating a laser radiation and a facet with a radiation exit area. The edge-emitting laser diode is designed to emit laser radiation during operation in a direction which is, for example, at least partially parallel to the main extension plane of the carrier. The active zone has a main extension plane which is parallel to the main extension plane of the carrier. Thus, the laser diode is not a surface emitter.

The laser diode can comprise different semiconductor materials, for example based on a III-V semiconductor material system. The laser diode can be arranged on the top surface of the carrier. The laser diode can be connected to the carrier via electrical contacts, so that the laser diode can be controlled via the carrier. For example, the laser diode has electrical contacts on the side facing the top surface of the carrier, said contacts being electrically connected to the carrier. Alternatively, it is possible that the laser diode is electrically connected to the carrier via bonding wires. The laser diode can be mechanically attached to the carrier on the top surface.

The facet is oriented transverse, preferably perpendicular to the main extension plane of the active zone. Furthermore, the facet is oriented transverse, preferably perpendicular to a main propagation direction of the laser radiation emitted during operation. In the radiation exit area, the laser radiation generated during operation exits the laser diode. The radiation exit area is in particular a sub-region of the facet and thus limited to the facet.

According to at least one embodiment of the semiconductor laser, the semiconductor laser comprises an optical element which covers the facet. The optical element can be designed to shape the emitted laser radiation. The optical element can completely cover the facet. For this purpose, the optical element can be attached to the facet. The optical element can also completely cover the radiation exit area.

According to at least one embodiment of the semiconductor laser, the semiconductor laser comprises a connecting material which is arranged between the optical element and the facet. The connecting material can cover the facet at least in places. For example, the facet is free of the connecting material in the radiation exit area. It is also possible that the connecting material completely covers the facet. The optical element is mechanically attached to the laser diode via the connecting material.

In particular, the connecting material is arranged between the optical element and the facet in such a way that the radiation exit area is hermetically encapsulated as far as possible. This means, for example, that the connecting material is arranged around the radiation exit area. Alternatively, the connecting material can cover the facet completely to hermetically encapsulate the facet. The fact that the radiation exit area is hermetically encapsulated can mean that the radiation exit area is encapsulated in an airtight manner against the environment of the semiconductor laser. The hermetic encapsulation of the radiation exit area protects it from environmental influences, for example mechanical or chemical influences from the environment of the semiconductor laser. For example, a water vapor transmission rate through the connecting material is at most $1\times10^{-3}$ g/m$^2$/day, preferably at most $3\times10^{-4}$ g/m$^2$/day.

The connecting material can include an inorganic material such as glass or metal. Furthermore, the connecting material may include a plastic such as a silicone, silicone derivatives, silazane, siloxane, poly-siloxane, poly-silazane or a silicone hybrid material. Alternatively, the connecting material may include an epoxy or a polymer of carbon-containing structural units.

According to at least one embodiment of the semiconductor laser, the semiconductor laser comprises a molded body which covers the laser diode and the optical element at least in places. The molded body can be an encapsulation. The molded body is designed to protect the laser diode from environmental influences. The molded body can be applied by an injection molding process, a so-called Dam & Fill process or by spraying (jetting). For example, the molded body contains an epoxy, thermoplastics, silicone or silicone derivatives.

According to at least one embodiment of the semiconductor laser, the optical element is at least partially transparent to the laser radiation emitted by the laser diode during operation. This means that the laser radiation generated during operation can pass the optical element at least partially. At a radiation entrance side of the optical element facing the radiation exit area, at least part of the laser radiation emitted by the laser diode can enter the optical element. At a radiation exit side of the optical element at least a part of the laser radiation can exit the optical element. The optical element can contain sapphire, diamond, SiC or organosilicon compounds. In particular, the optical element exhibits low absorption of the laser radiation emitted by the laser diode during operation. Furthermore, the optical element may have a high thermal conductivity.

According to at least one embodiment of the semiconductor laser, the optical element is designed to change the main propagation direction of the laser radiation entering the optical element during operation. The laser radiation emitted by the laser diode can have a main propagation direction which is parallel to the main extension plane of the carrier, for example. The main direction of propagation can be the beam direction of the laser radiation. The laser radiation exiting from the semiconductor laser has a main propagation direction which is different from the main propagation direction of the laser radiation emitted by the laser diode. By passing the optical element, the main propagation direction of the laser radiation is changed. For example, the main propagation direction of the laser radiation exiting the laser diode is transverse or perpendicular to the main extension plane of the carrier.

For this purpose, the optical element can have the shape of a segment of a sphere or an ellipsoid. For example, the optical element has the shape of a quarter sphere. This means that the shape of the optical element corresponds to a quarter of a sphere.

According to at least one embodiment of the semiconductor laser, the semiconductor laser comprises a carrier, an edge-emitting laser diode arranged on the carrier and having an active zone for generating a laser radiation and a facet with a radiation exit area, an optical element covering the facet, a connecting material arranged between the optical element and the facet, a molded body covering the laser diode and the optical element at least in places, the optical element being at least partially transparent to the laser radiation emitted by the laser diode during operation, and the optical element being designed to change the main propagation direction of the laser radiation entering the optical element during operation.

The semiconductor laser described here is based, among other things, on the idea that the semiconductor laser can be operated in a normal atmosphere without any additional gas-tight encapsulation. This means that an encapsulation and a protection of the facet, especially of the radiation exit area, is achieved by the connecting material together with the optical element. Furthermore, the laser diode is encapsulated by the molded body. This means that the semiconductor laser does not require a hermetically sealed housing. Due to the optical element arranged on the facet and the molded body, the laser diode and the facet are already protected against environmental influences. It is therefore not necessary to place the laser diode in a larger housing in a cavity and seal the housing. Therefore less installation space is needed for the semiconductor laser.

By encapsulating the facet, the facet is protected against depositing particles from the environment of the laser diode. The deposition or accumulation of particles on the facet, especially in the radiation exit area, can lead to an interaction with the emitted laser radiation and to heating in the area of the facet. This can lead to destruction of the laser diode. Deposits on the facet can be decomposed and burned in, especially by short-wave radiation. Such changes in the area of the facet reduce a decoupling efficiency of the semiconductor laser and can damage a facet coating, for example by optical absorption in the deposits, which in turn can lead to overheating. Therefore, it proves to be particularly advantageous to seal the facet by the connecting material. In addition, the semiconductor laser can be manufactured more cost-effectively and installed with reduced space requirements.

By using an optical element, the beam divergence of the laser radiation exiting the laser diode can be reduced. Otherwise, the field strength in the divergent beam could suck in potential contaminants in the vicinity of the facet and cause them to be deposited on the facet, similar to optical tweezers. Thus, a reduction of the beam divergence leads directly to a reduction of the deposits.

Furthermore, the use of the optical element can increase an interface to the atmosphere. By increasing the interface, the amount of potential deposits per unit area decreases. Furthermore, the energy density at this interface is reduced compared to the energy density directly at the facet.

The optical element also offers the possibility of shaping and redirecting the laser radiation exiting the laser diode. Thus the edge-emitting laser diode can be used in a surface-emitting semiconductor laser.

Since the optical element can contain a material with a high thermal conductivity, heat can be dissipated via the optical element. This prevents overheating of the facet.

Since the semiconductor laser already comprises an optical element, downstream optics can be made smaller and less complex. All in all, the integration of optics, logic and sensor technology in the vicinity of the semiconductor laser is simplified by the reduced installation space.

Advantageously, the semiconductor laser can be manufactured in a composite and can be separated into individual semiconductor lasers late in the manufacturing process.

According to at least one embodiment of the semiconductor laser, the molded body completely covers the laser diode on at least one side. The molded body can completely cover the laser diode on a side facing away from the carrier. It is also possible that the molded body completely covers the laser diode on a side that is transverse or perpendicular to the main extension plane of the carrier. In particular, the molded body can completely cover the laser diode on at least one side, so that the molded body encapsulates the laser diode. The molded body can serve to protect the laser diode from environmental influences from the environment of the semiconductor laser. Due to the molded body and other elements surrounding the laser diode, such as the carrier, the laser diode is not in direct contact with the environment of the semiconductor laser. The molded body can be in direct contact with the laser diode at least in places. Thus, the molded body can be molded directly onto the laser diode. By using the molded body, no surrounding housing with a cavity for the laser diode is needed to protect the laser diode from environmental influences from the environment of the semiconductor laser.

According to at least one embodiment of the semiconductor laser, the main radiation direction of the laser diode is transverse or perpendicular to the main radiation direction of the semiconductor laser. The main radiation direction of the laser diode corresponds to the main propagation direction of the laser radiation emitted by the laser diode during operation. The main radiation direction of the semiconductor laser corresponds to the main propagation direction of the laser radiation emitted by the semiconductor laser during operation. This means that the main propagation direction of the laser radiation emitted by the laser diode during operation is changed by passing the optical element in such a way that the main propagation direction of the laser radiation exiting the semiconductor laser is transverse or perpendicular to the main radiation direction of the semiconductor laser. For example, the main radiation direction of the semiconductor laser extends in a direction away from the carrier. Thus, the edge-emitting laser diode can be advantageously used for a surface-emitting semiconductor laser.

Furthermore, it is possible that the main radiation direction of the semiconductor laser is parallel to a lateral direction and not parallel to the main radiation direction of the laser diode, the lateral direction being parallel to the main extension plane of the carrier. Thus, the laser radiation can be coupled laterally out of the semiconductor laser.

In order to change the main propagation direction of the laser radiation, the optical element may have diffractive optical structures. For example, a diffractive optical element is arranged at the radiation entrance side and/or at the radiation exit side of the optical element. The diffractive optical element can be designed to shape laser radiation.

According to at least one embodiment of the semiconductor laser, the carrier is surrounded at least in places by the molded body in lateral directions, the lateral directions being parallel to the main extension plane of the carrier. This can mean that side surfaces of the carrier, which are transverse or perpendicular to the main extension plane of the carrier, are covered by the molded body at least in places. The molded body may be in direct contact with the carrier in places. It is also possible that the carrier is completely surrounded by the molded body in lateral directions. Thus the carrier and the laser diode can be encapsulated by the molded body and protected from environmental influences from the environment of the semiconductor laser.

According to at least one embodiment of the semiconductor laser, the molded body is formed by means of a casting and/or injection molding process. These processes include all manufacturing processes in which a molding compound is introduced into a predetermined mold and, in particular, is subsequently hardened. In particular, the term casting process includes casting, injection molding, transfer molding and compression molding. Thus the molded body can be molded to the laser diode. The molded body can have a molding compound. A molded body formed by a casting and/or injection molding process can hermetically seal the laser diode against environmental influences.

According to at least one embodiment of the semiconductor laser, the semiconductor laser has a radiation exit surface that is free of the molded body. The radiation exit surface can be located on a side of the semiconductor laser facing away from the carrier. The radiation exit surface can have a main extension plane which is parallel to the main extension plane of the carrier. It is also possible that the radiation exit surface is curved or not plane. The radiation exit surface of the semiconductor laser can be a radiation exit surface of the optical element. Alternatively, the radiation exit surface of the semiconductor laser can be a radiation exit surface of a component of the semiconductor laser downstream of the optical element. It is therefore not necessary that the molded body is transparent for the laser radiation emitted by the laser diode.

According to at least one embodiment of the semiconductor laser, the optical element completely covers the facet. This means that a side surface of the optical element facing the facet is at least as large as the surface of the facet. The optical element covers the facet completely in a lateral direction. The optical element and the facet are connected to each other via the connecting material. The optical element thus encapsulates the facet completely against environmental influences from the environment of the semiconductor laser.

According to at least one embodiment of the semiconductor laser, an anti-reflective layer is applied on the optical element on the side facing the radiation exit area. The optical element may have a radiation entrance side facing the radiation exit area. The radiation entrance side of the optical element can have a reflectivity of at most 0.5% or at most 0.1% for the laser radiation emitted by the laser diode. This prevents or reduces feedback of reflected laser radiation into the laser diode. In addition, it improves the efficiency of the semiconductor laser.

According to at least one embodiment of the semiconductor laser, the optical element has a radiation exit side on which a further anti-reflective layer is applied. The laser radiation entering the optical element can be deflected in the optical element in such a way that the laser radiation leaves the optical element at the radiation exit side. The radiation exit side of the optical element can have a reflectivity of at most 0.5% or at most 0.1% for the laser radiation emitted by the laser diode. Thus, losses in the semiconductor laser are minimized and the efficiency of the semiconductor laser is improved.

According to at least one embodiment of the semiconductor laser, a photocatalytically acting layer is applied on the radiation exit side of the optical element to support decomposition reactions on the radiation exit side. The photocatalytically acting layer is designed to remove and/or decompose deposits on the radiation exit side by means of the laser radiation. Thus, the photocatalytically acting layer influences the reaction equilibrium between deposition and cleaning by decomposition. The photocatalytically acting layer is formed in particular by a metal oxide such as titanium dioxide or zirconium oxide. Alternatively, the photocatalytically acting layer contains platinum, palladium or rhodium. If the photocatalytically acting layer contains a metal, it preferably has a thickness of at most 10 nm or 5 nm or 3 nm, so that the laser radiation can pass through the photocatalytically acting layer without significant losses. Thus, by applying a photocatalytically acting layer on the radiation exit side of the optical element, an accumulation of undesired material can be reduced or prevented.

According to at least one embodiment of the semiconductor laser, the optical element is designed to shape the laser radiation entering the optical element during operation. This may mean that the optical element is designed to change the main propagation direction of the laser radiation. It is also possible that the optical element is designed to change other parameters of the laser radiation, such as the beam divergence. To shape the incoming laser radiation, the optical element can have at least one diffractive optical element. In particular, the optical element can have at least one metallic or dielectric mirror layer or a mirror layer which is built up from a combination of metallic and dielectric mirrors. The mirror layer or mirror layers can be arranged on surfaces of the optical element. Furthermore, the optical element may have one or more masks for shaping the laser radiation. By using the optical element, which is designed to shape the laser radiation, downstream optics can be made smaller and less complex.

According to at least one embodiment of the semiconductor laser, the semiconductor laser comprises two further edge-emitting laser diodes, each of which is arranged on a carrier. The laser diode and the two further laser diodes can be arranged side by side in a lateral direction. Each of the further laser diodes is arranged on a carrier. Each of the further laser diodes can have the same structure as the laser diode. One optical element each can cover the facet of one further laser diode. The laser diode and the two further laser diodes can be designed to generate laser radiation in different wavelength ranges during operation. This can mean that the laser diode is designed to generate laser radiation in a first wavelength range. One of the further laser diodes can be designed to generate laser radiation in a second wavelength range, and the other of the further laser diodes can be designed to generate laser radiation in a third wavelength range.

For example, the first wavelength range can be the red range of the electromagnetic spectrum, for example the range between 600 nm and 780 nm. The second wavelength range can be the green range of the electromagnetic spectrum, for example the range between 490 nm and 570 nm. The third wavelength range can be the blue range of the electromagnetic spectrum, for example the range between 430 nm and 490 nm.

By using the laser diode and the two further laser diodes, mixed light can be generated. Furthermore, it is possible to emit laser radiation in three different colors, for example red, green and blue, whereby the semiconductor laser requires only a small installation space.

According to at least one embodiment of the semiconductor laser, the semiconductor laser comprises a beam combiner. The beam combiner is arranged downstream of the three optical elements of the laser diode and the two further laser diodes. The beam combiner is designed to mix the laser radiation emitted by the laser diode and the two further laser diodes and to generate a mixed light. For example, the beam combiner has a radiation entrance side where the laser radiation which exits the optical elements during operation enters the beam combiner. The beam combiner may have a radiation exit side where the mixed light exits the beam combiner. For example, the beam combiner is connected to the optical elements by a connecting material, for example silicone. The radiation exit side of the beam combiner can form the radiation exit surface of the semiconductor laser. Advantageously, the semiconductor laser can thus emit mixed light, for example white mixed light.

According to at least one embodiment of the semiconductor laser, the optical element is followed by a conversion element which is designed to convert the wavelength of the radiation emitted by the laser diode during operation. In particular, it is possible that the conversion element is designed to convert the wavelength of at least part of the radiation emitted by the laser diode during operation. By changing the wavelength of the radiation emitted by the laser diode during operation, for example, white mixed light with a high color rendering index can be generated.

In the following, the semiconductor laser described here is explained in more detail in conjunction with exemplary embodiments and the corresponding figures.

Identical, similar or equivalent elements are provided with the same reference signs in the figures. The figures and the proportions of the elements represented in the figures among each other are not to be considered as true to scale. Rather, individual elements may be oversized for better representability and/or for better comprehensibility.

Figure 1:
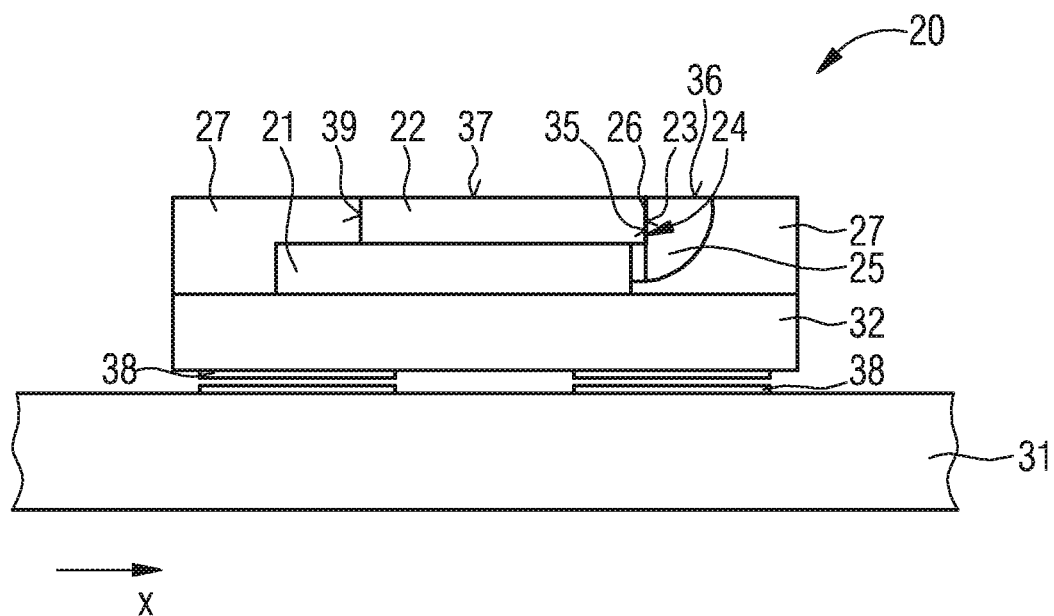
FIG. 1 shows a schematic cross-section through a semiconductor laser according to an exemplary embodiment.

FIG. 1 shows a semiconductor laser 20 according to an exemplary embodiment. The semiconductor laser 20 comprises a carrier 21 with a main plane of extension. An edge-emitting laser diode 22 is arranged on the carrier 21. The laser diode 22 has an active zone for generating laser radiation and a facet 23 with a radiation exit area 24. The laser radiation generated by the laser diode 22 during operation has a main direction of propagation which is parallel to the main extension plane of the carrier 21. The semiconductor laser 20 further comprises an optical element 25. The optical element 25 completely covers the facet 23 and the radiation exit area 24. The optical element 25 is arranged next to the laser diode 22 in lateral direction x, the lateral direction x being parallel to the main extension plane of the carrier 21. The optical element 25 has the shape of a quarter sphere. One of the flat outer surfaces of the quarter sphere faces the facet 23. Another of the flat outer surfaces of the quarter sphere faces a side facing away from the carrier 21.

A connecting material 26 is arranged between the optical element 25 and the facet 23. The optical element 25 is mechanically connected to the facet 23 via the connecting material 26. The optical element 25 is partially transparent to the laser radiation emitted by the laser diode 22 during operation. The optical element 25 has a radiation entrance side 35 assigned to the facet 23. Furthermore, the optical element 25 has a radiation exit side 36 facing away from the carrier 21. Thus, the optical element 25 is designed to change the main propagation direction of the laser radiation entering the optical element 25 during operation. This means that the main radiation direction of the laser diode 22 is perpendicular to the main radiation direction of the semiconductor laser 20. The main propagation direction of the laser radiation exiting at the radiation exit side 36 is perpendicular to the main radiation direction of the laser diode 22.

In addition, the semiconductor laser 20 has a molded body 27, which covers the laser diode 22 and the optical element 25 at least in places. The molded body 27 surrounds the laser diode 22, the carrier 21 and the optical element 25 in lateral directions x. Thereby, the molded body 27 completely covers the laser diode 22 on lateral surfaces 39. The side surfaces 39 of the laser diode 22 extend transversely or perpendicularly to the main extension plane of the carrier 21. A top side 37 of the laser diode 22 facing away from the carrier 21 is free of the molded body 27. The radiation exit side 36 of the optical element 25 facing away from the carrier 21 is also free of the molded body 27. The radiation exit side 36 has a planar, i.e. not curved, shape. The molded body 27 is formed by a casting and/or injection molding process.

The carrier 21 and the molded body 27 are arranged on a substrate 32. Here, the molded body 27 is in direct contact with the substrate 32. The substrate 32 contains a semiconductor material such as aluminum nitrite. The substrate 32 is arranged on a connection carrier 31. Electrical contacts 38 are arranged between the substrate 32 and the connection carrier 31. Via the electrical contacts 38 the laser diode 22 can be controlled. The connection carrier 31 can be a printed circuit board.

Figure 2:
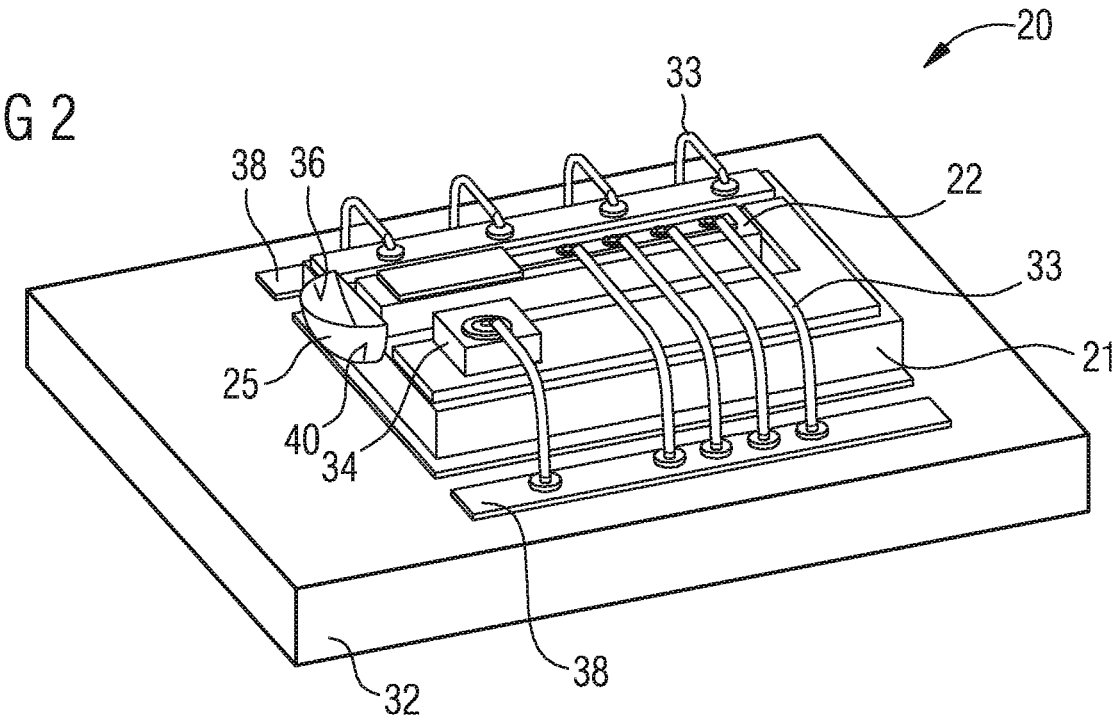
FIG. 2 shows a top view of a semiconductor laser according to an exemplary embodiment.

FIG. 2 shows a top view of the semiconductor laser 20 according to another exemplary embodiment. The molded body 27 is not shown in this illustration. Electrical contacts 38 are arranged on the substrate 32. The electrical contacts 38 are electrically connected to the laser diode 22 and the carrier 21 via bonding wires 33. An optional ESD (electrostatic discharge) element 34 is also arranged on the carrier 21.

The optical element 25 is designed to shape the laser radiation entering the optical element 25 during operation. For this purpose, the optical element 25 can have diffractive elements. In addition, a mirror layer 40 is applied to the curved outer surface of the optical element 25. The mirror layer 40 can be metallic or dielectric or a combination of both.

In addition, an anti-reflective layer may be applied on the radiation entrance side 35 of the optical element 25. Furthermore, an anti-reflective layer can also be applied on the radiation exit side 36 of the optical element 25. A photocatalytically acting layer can be applied on the radiation exit side 36 of the optical element 25 to support decomposition reactions on the radiation exit side 36.

Figure 3:
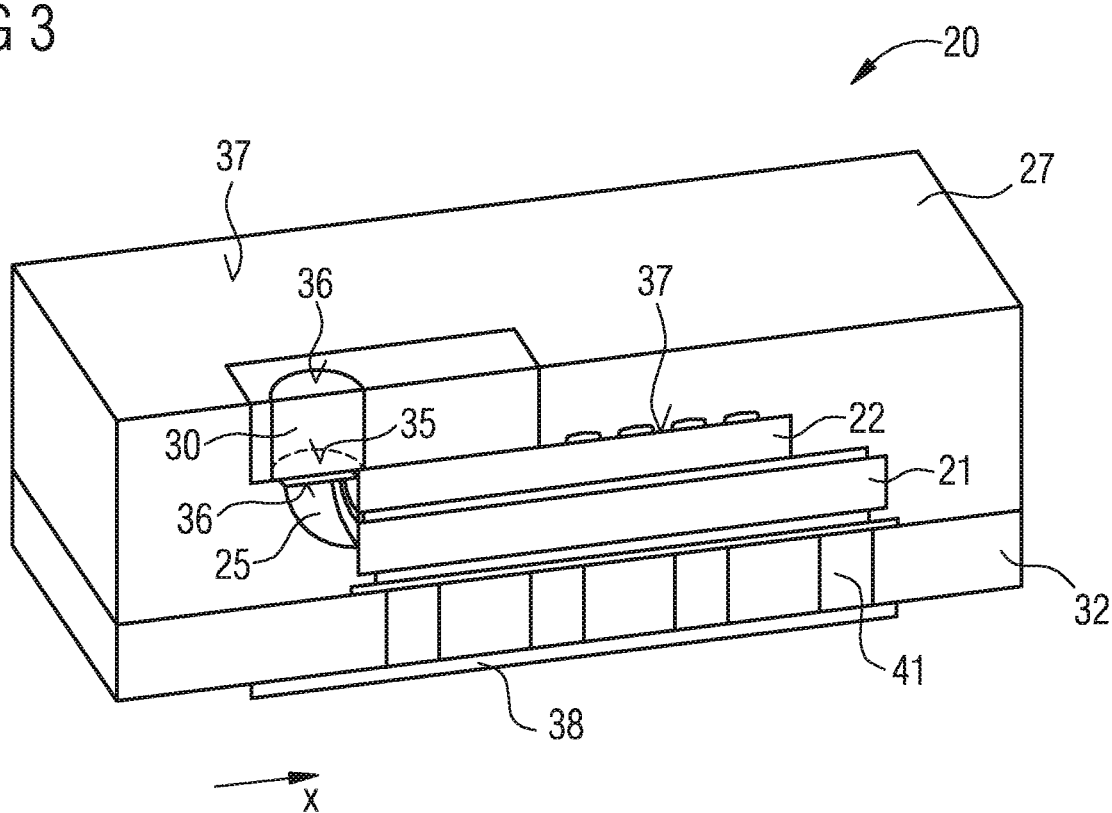
FIGS. 3 and 4 show schematic cross-sections through a semiconductor laser according to two exemplary embodiments.

FIG. 3 shows a schematic cross-section through the semiconductor laser 20 according to another exemplary embodiment. In contrast to the exemplary embodiment of FIG. 1, the molded body 27 covers the laser diode 22 on a top side 37 facing away from the carrier 21. Thus, the laser diode 22 is completely encapsulated and protected against environmental influences from the environment of the semiconductor laser 20. No additional housing or cavity in which the laser diode 22 is located is required. Through-connections 41 are arranged in the substrate 32. The through-connections 41 are filled with an electrically conductive material. The through-connections 41 extend from a side of the substrate 32 facing away from the carrier 21 to the carrier 21. On the side of the substrate 32 facing away from the carrier 21 an electrical contact 38 is arranged, via which the carrier 21 can be electrically connected to the connection carrier 31. The connection carrier 31 is not shown in this illustration.

Furthermore, the optical element 25 is followed by a conversion element 30, which is designed to convert the wavelength of the radiation emitted by the laser diode 22 during operation. The conversion element 30 has a radiation entrance side 35, which faces the radiation exit side 36 of the optical element 25. On a top side 37 of the semiconductor laser 20 facing away from the substrate 32, the conversion element 30 has a radiation exit side 36. Thus, the main propagation direction of the laser radiation exiting the optical element 25 is not significantly changed by passing through the conversion element 30. The conversion element 30 can have the shape of a cylinder. Furthermore, the conversion element 30 can have a matrix material in which conversion particles are incorporated. In lateral directions x the conversion element 30 is completely surrounded by the molded body 27.

Figure 4:
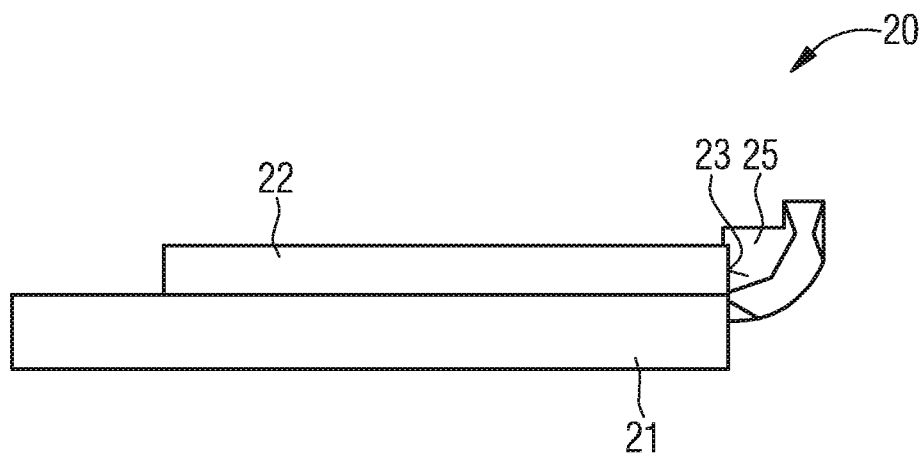

FIG. 4 shows a schematic cross-section through the semiconductor laser 20 according to another exemplary embodiment. Only the laser diode 22, the carrier 21 and the optical element 25 are shown. The other components of the semiconductor laser 20 are not shown. In the optical element 25 the beam path of the laser radiation emitted by the laser diode 22 during operation is shown. It is shown that the main propagation direction of the laser radiation exiting the facet 23 of the laser diode 22 is parallel to the main extension plane of the carrier 21. In the optical element 25 the laser radiation is shaped and deflected so that the main propagation direction of the laser radiation exiting the optical element 25 is perpendicular to the main extension plane of the carrier 21.

Figure 5A:
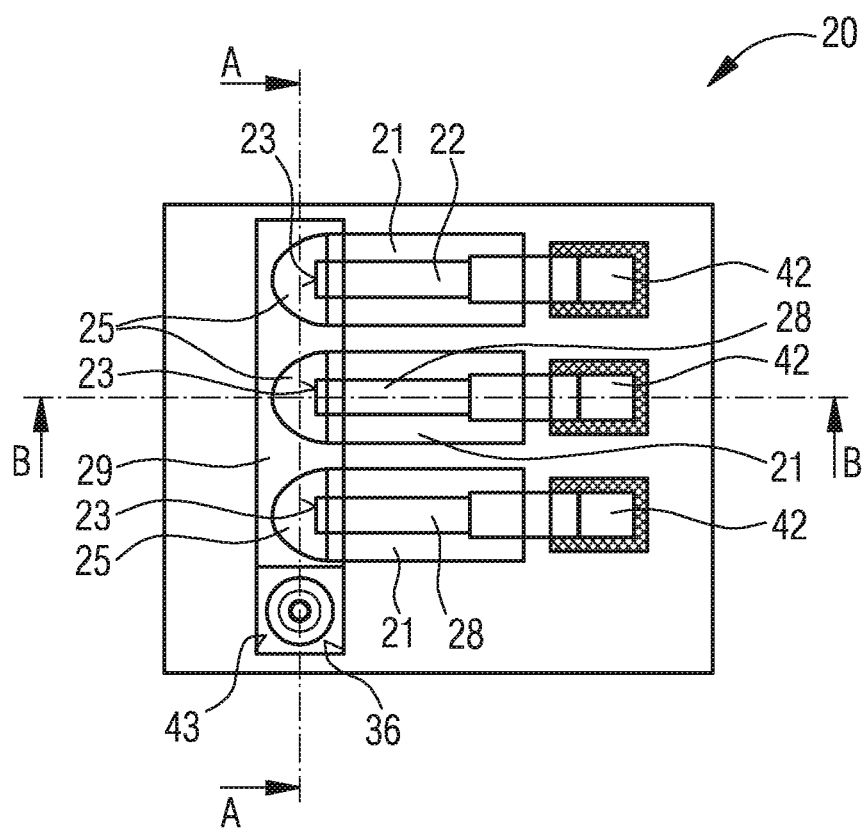
FIGS. 5A, 5B and 5C show different views of a semiconductor laser according to an exemplary embodiment.

FIG. 5A shows a top view of the semiconductor laser 20 according to another exemplary embodiment. The semiconductor laser 20 comprises the laser diode 22 and two further edge-emitting laser diodes 28. Each of the further laser diodes 28 is arranged on a carrier 21. In addition, one optical element 25 covers the facet 23 of each further laser diode 28. The laser diodes 22 and the further laser diodes 28 are designed to emit laser radiation of different colors during operation. For example, the laser diode 22 can be designed to emit red laser radiation during operation. One of the further laser diodes 28 can be designed to emit blue laser radiation during operation. The other one of the further laser diodes 28 can be designed to emit green laser radiation during operation.

The three optical elements 25 are followed by a beam combiner 29. The beam combiner 29 is designed to mix the laser radiation emitted by the laser diode 22 and the further laser diodes 28 and to generate a mixed light. For this purpose, the beam combiner 29 has a radiation entrance side 35, which faces the radiation exit side 36 of the optical elements 25. In addition, the beam combiner 29 has a radiation exit side 36 where the mixed light exits the beam combiner 29. The beam combiner 29 can be connected to the optical elements 25 via a connecting material such as silicone.

Furthermore, the semiconductor laser 20 has three monitoring diodes 42. Each of the monitoring diodes 42 is assigned to one of the laser diodes 22, 28. The monitoring diode 42 is arranged on the side of the laser diodes 22, 28 facing away from the facet 23. The monitoring diodes 42 are designed to detect laser radiation emitted on the side facing away from the facet 23. Thus, the intensity of the laser radiation emitted by the laser diodes 22, 28 can be approximately determined. This is advantageous, for example, if the semiconductor laser 20 is used in an application that is used by humans. Too high intensities that are harmful to the eyes can be avoided.

On the side of the laser diode 22 and the further laser diodes 28 facing away from the facet 23, an additional heat sink can be arranged, which has a high thermal conductivity and can dissipate heat from the laser diode 22 and the further laser diodes 28. The heat sink is not shown.

Figure 5B:
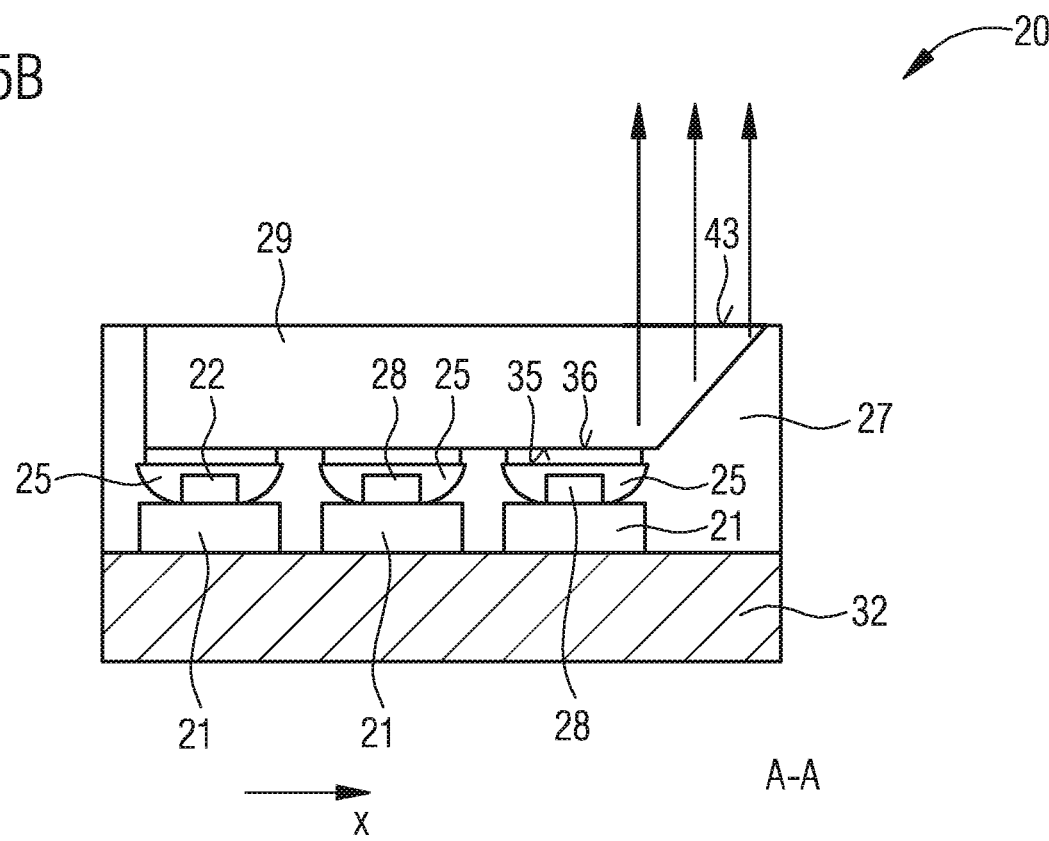

FIG. 5B shows a cross-section through the semiconductor laser 20 along line AA shown in FIG. 5A. The laser diodes 22 and the two further laser diodes 28 are arranged next to each other in lateral direction x. The optical elements 25 have the shape of a quarter sphere. The beam combiner 29 covers the three optical elements 25. The molded body 27 completely surrounds the laser diode 22, the further laser diodes 28, the carriers 21 and the beam combiner 29 in lateral directions x. A side of the beam combiner 29 facing away from the substrate 32 is free of the molded body 27.

The beam combiner 29 has a radiation exit surface 43. The radiation exit surface 43 of the beam combiner 29 is arranged next to the laser diode 22 and the two further laser diodes 28 in lateral direction x. The radiation exit surface 43 of the beam combiner 29 is smaller than the lateral extension of the beam combiner 29. Since the beam combiner 29 is free of the molded body 27 on the side facing away from the substrate 32, the radiation exit surface 43 of the beam combiner 29 forms a radiation exit surface 43 of the semiconductor laser 20. The semiconductor laser 20 is designed to emit mixed light, in particular white mixed light, through the radiation exit surface 43.

Figure 5C:
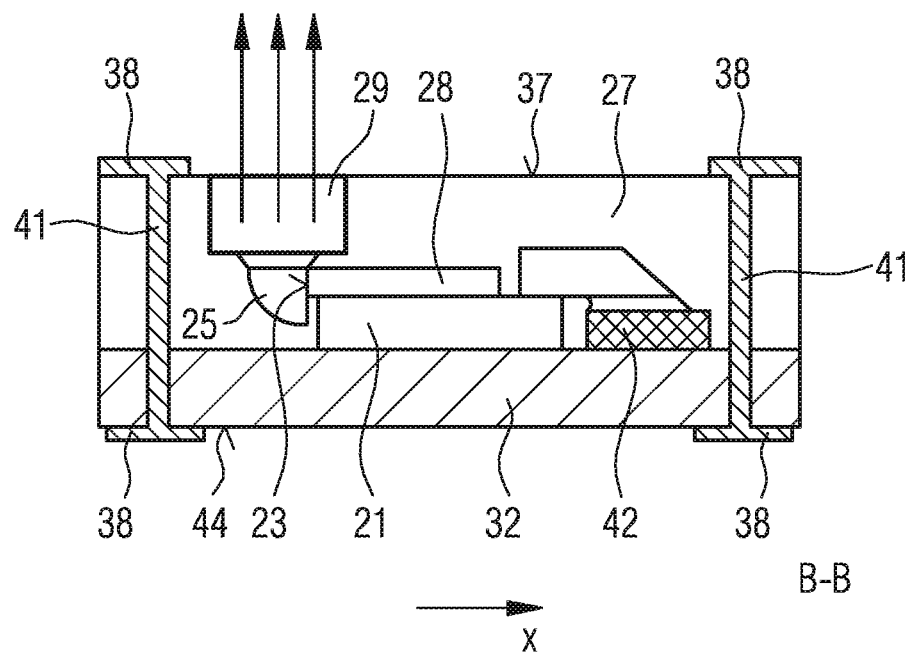

FIG. 5C shows a cross-section through the semiconductor laser 20 along line BB shown in FIG. 5A. The further laser diode 28 with the carrier 21 and the optical element 25 has the structure of the laser diode 22 shown in FIGS. 1 and 2. The monitoring diode 42 is arranged on the side facing away from the facet 23. The further laser diode 28, the optical element 25, the carrier 21, the beam combiner 29 and the monitoring diode 42 are completely surrounded by the molded body 27 in lateral directions x.

Through the molded body 27, through-connections 41 extend from a top side 37 of the molded body 27 facing away from the substrate 32 to the substrate 32. The connection carrier 31 is not shown in this illustration. The through-connections 41 extend further through the substrate 32 from the side facing the molded body 27 to a bottom side 44 of the substrate 32 facing away from the molded body 27. The through-connections 41 contain an electrically conductive material. Electrical contacts 38 are arranged on the top side 37 of the molded body 27, said contacts being electrically connected to the through-connections 41. Via the through-connections 41, the electrical contacts 38 on the top side 37 of the molded body 27 are electrically connected to electrical contacts 38 on the bottom side 44 of the substrate 32. Furthermore, the through-connections 41 are electrically connected to the carrier 21 and thus to the laser diodes 22, 28 via the substrate 32. If a large number of electrical contacts 38 are required for contacting, for example, the laser diodes 22, 28 and the monitoring diodes 42, it is advantageous to arrange electrical contacts 38 both on the top side 37 of the molded body 27 and on the bottom side 44 of the substrate 32. However, it is also possible that electrical contacts 38 are arranged only on the top side 37 of the molded body 27 or only on the bottom side 44 of the substrate 32.

Figure 6:
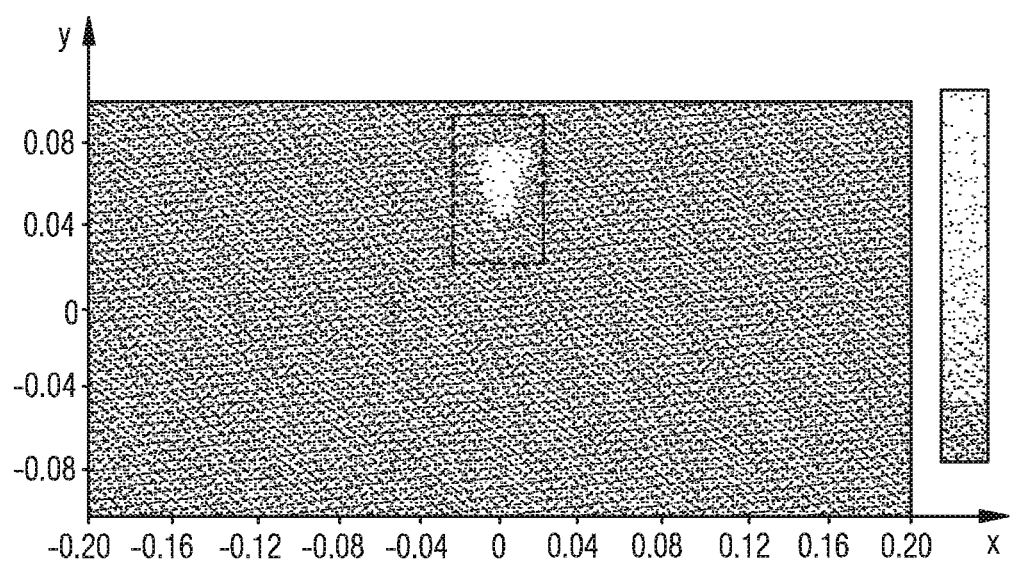
FIG. 6 shows the energy distribution of the laser radiation exiting at a radiation exit side for a semiconductor laser according to an exemplary embodiment.

FIG. 6 shows the energy distribution of the laser radiation exiting at the radiation exit side 36 for the semiconductor laser 20 according to an exemplary embodiment. On the x-axis a lateral expansion in lateral direction x is plotted in millimeters. On the y-axis, a further lateral expansion, which is perpendicular to the lateral direction x, is plotted in millimeters. The colored z-component shows the intensity of the laser radiation exiting the semiconductor laser 20 on the radiation exit side 36. The intensity of the laser radiation is highest at the center of the radiation exit surface 43. The semiconductor laser 20 is the exemplary embodiment shown in FIG. 4.

The invention is not limited to the exemplary embodiments by the description based on the same. Rather, the invention comprises any new feature as well as any combination of features, which in particular includes any combination of features in the claims, even if this feature or this combination itself is not explicitly stated in the claims or exemplary embodiments.

LIST OF REFERENCE SIGNS

20: semiconductor laser
21: carrier
22: laser diode
23: facet
24: radiation exit area
25: optical element
26: connecting material
27: molded body
28: further laser diode
29: beam combiner
30: conversion element
31: connection carrier
32: substrate
33: bonding wire
34: ESD element
35: radiation entrance side
36: radiation exit side
37: top side
38: electrical contact
39: side surface
40: mirror layer
41: through-connection
42: monitoring diode
43: radiation exit surface
44: bottom side
x: lateral direction

The invention claimed is:

1. A semiconductor laser comprising:
a carrier,
an edge-emitting laser diode which is arranged on the carrier and which has an active zone for generating laser radiation and a facet with a radiation exit area,
an optical element which covers the facet,
a connecting material which is arranged between the optical element and the facet,
a molded body which covers the laser diode and the optical element at least in places, wherein
the optical element is at least partially transparent to the laser radiation emitted by the laser diode during operation, and
the optical element is designed to change the main propagation direction of the laser radiation entering the optical element during operation,
the optical element has a radiation exit side, and
a photocatalytically acting layer is applied on the radiation exit side of the optical element to support decomposition reactions on the radiation exit side.

2. The semiconductor laser according to claim 1, in which the molded body completely covers the laser diode on at least one side.

3. The semiconductor laser according to claim 1, in which the main radiation direction of the laser diode is transverse or perpendicular to the main radiation direction of the semiconductor laser.

4. The semiconductor laser according to claim 1, in which the carrier is surrounded at least in places by the molded body in lateral directions, the lateral directions being parallel to the main extension plane of the carrier.

5. The semiconductor laser according to claim 1, in which the molded body is formed by means of a casting and/or injection molding process.

6. The semiconductor laser according to claim 1, which has a radiation exit surface that is free of the molded body.

7. The semiconductor laser according to claim 1, in which the optical element completely covers the facet.

8. The semiconductor laser according to claim 1, in which an anti-reflective layer is applied on the optical element on the side facing the radiation exit area.

9. The semiconductor laser according to claim 1, in which a further anti-reflective layer is applied on the radiation exit side of the optical element.

10. The semiconductor laser according to claim 1, in which the optical element is designed to shape the laser radiation entering the optical element during operation.

11. The semiconductor laser according to claim 1, which comprises two further edge-emitting laser diodes, each of which is arranged on a carrier.

12. The semiconductor laser according to claim 11, which comprises a beam combiner.

13. The semiconductor laser according to claim 1, in which the optical element is followed by a conversion element which is designed to convert the wavelength of the radiation emitted by the laser diode during operation.

* * * * *